United States Patent
Scott et al.

(10) Patent No.: US 7,333,181 B1
(45) Date of Patent: Feb. 19, 2008

(54) METHODS FOR THE USE AND MANUFACTURE OF INFRARED POSITION SENSING DETECTOR FOCAL PLANE ARRAYS FOR OPTICAL TRACKING

(75) Inventors: Basil H. Scott, Kapaa, HI (US); Randy Wolfshagen, Koloa, HI (US); Jeff Buck, Kapaa, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 0 days.

(21) Appl. No.: 11/434,558

(22) Filed: May 15, 2006

Related U.S. Application Data

(60) Provisional application No. 60/680,742, filed on May 13, 2005.

(51) Int. Cl.
*G01C 5/00* (2006.01)
(52) U.S. Cl. .................. 356/3.08; 356/3.09; 356/3.1
(58) Field of Classification Search ............... 356/3.08
See application file for complete search history.

(56) References Cited

U.S. PATENT DOCUMENTS

| | | | | |
|---|---|---|---|---|
| 5,021,663 A | * | 6/1991 | Hornbeck | 250/349 |
| 5,311,020 A | * | 5/1994 | Silver et al. | 250/338.4 |
| 5,724,168 A | * | 3/1998 | Oschmann et al. | 398/127 |

* cited by examiner

*Primary Examiner*—Thomas H. Tarcza
*Assistant Examiner*—Luke Ratcliffe
(74) *Attorney, Agent, or Firm*—James Creighton Wray; Clifford D. Hyra

(57) ABSTRACT

A Sensor Chip Assembly (SCA) contains a focal plane array constructed as a semiconductor chip sandwich. One slice contains an array of PSDs made from IR sensitive semiconductor material, and the other slice contains Trans Impedance Amplifiers (TIAs)—and associated on-chip signal processing elements from an electronic semiconductor material. The SCA resembles those made for pixelized imaging IR SCA focal planes, but the configuration and implementation of which is for a PSD focal plane array. The use of these techniques assures that the PSD focal plane array possesses the required attributes. Interconnect technology is widely available from most IR fabrication houses to connect the IR array with the TIA circuits.

20 Claims, 9 Drawing Sheets

Sensor Chip Assembly (SCA) Direct Hybrid Approach

Equivalent virtual signal after background subtraction

PSD element illuminated with uneven background signals

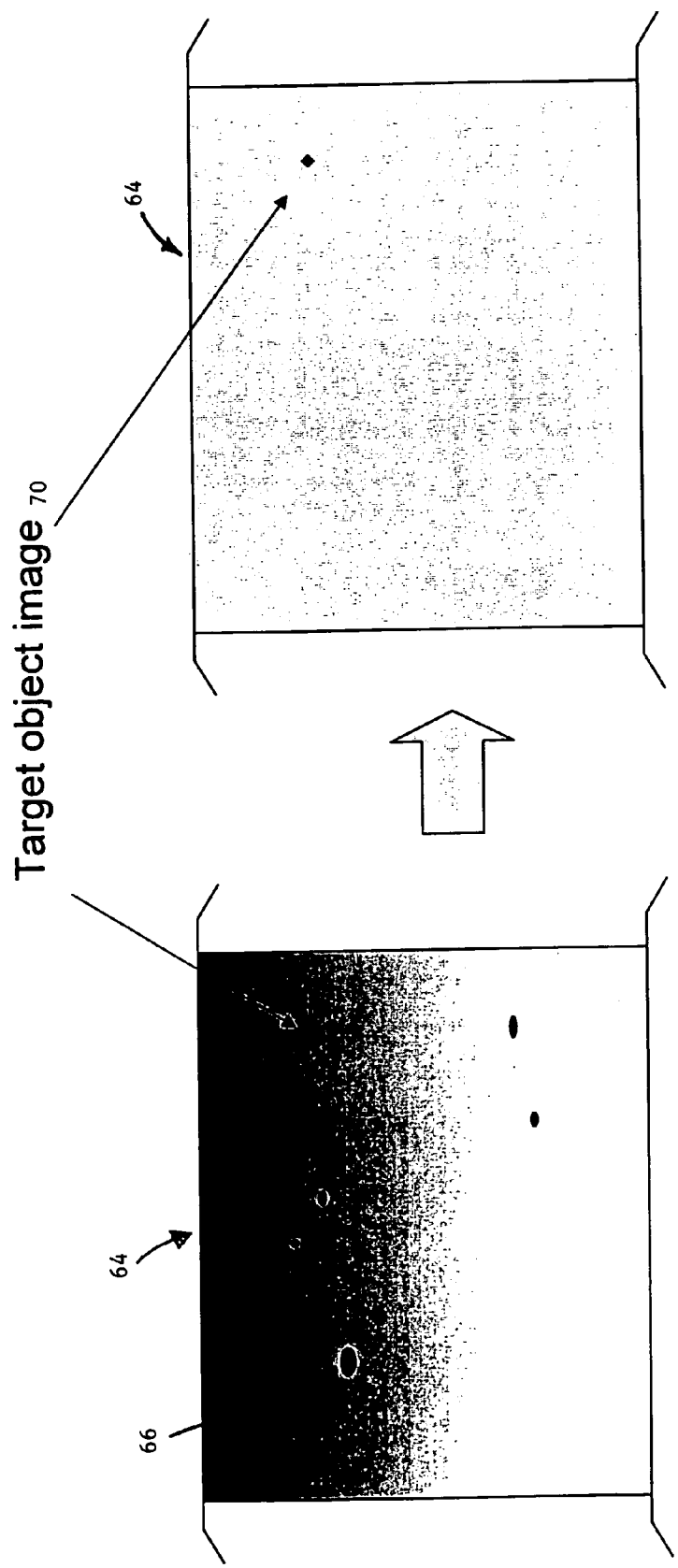
Figure 7B — Equivalent virtual signal after background subtraction
Figure 7A — PSD illuminated with uneven background and target signals

METHODS FOR THE USE AND MANUFACTURE OF INFRARED POSITION SENSING DETECTOR FOCAL PLANE ARRAYS FOR OPTICAL TRACKING

This application claims the benefit of U.S. Provisional Application No. 60/680,742, filed May 13, 2005, which is hereby incorporated by reference in its entirety.

BACKGROUND OF THE INVENTION

Tracking is a basic surveillance function that is important in numerous commercial and military applications. Increasingly, there is a requirement to augment, or even replace, the radar technology traditionally used for this task with optical tracking systems.

Key applications include missile tracking for theater and national defense systems, battlefield defensive systems (e.g. sniper detection), homeland security defensive systems, and the like. However, the utility of existing optical tracking systems for these missions is limited by their speed, accuracy and detection capability.

Needs exist for extending these limits to new operational regimes.

SUMMARY OF THE INVENTION

The present invention addresses the needs of prior systems. Position Sensing Detector (PSD) based Focal Plane Array (FPA) extends the limits of existing systems to new operational regimes.

When a two-dimensional array of Position Sensing Detectors (PSDs) is used as the focal plane sensor in an infrared (IR) optical tracking system, special methods are required for object detection, high accuracy location, and multiple target processing. The need for passive tracking—sensing the IR emission from the target with no active illumination (e.g. laser illumination)—requires special background mitigation techniques that function in combination with detection and location methods. These methods differ substantially from those used for the pixel arrays in traditional camera-based optical tracking systems and from those used for non-arrayed PSD devices.

Producing a PSD array suitable for use as a focal plane array in an optical system requires manufacturing methods different from those used for current PSD devices and arrays. Some of these methods, even if available today, have not been applied to the PSD solution.

In order to use a PSD focal plane array in an optical tracking application, it must possess several characteristics: uniform element-to-element characteristics, close spacing between elements, tightly integrated electronics circuits for amplification and initial signal processing, and the capability to package thousands of PDS devices on a single focal plane if required.

To achieve these requirements, the focal plane array is constructed as a semiconductor chip sandwich—one slice contains the array of PSDs made from IR sensitive semiconductor material, and the other slice contains Trans Impedance Amplifiers (TIAs)—and associated on-chip signal processing elements from an electronic semiconductor material. A resulting Sensor Chip Assembly (SCA) resembles those made for pixelized imaging IR SCA focal planes, but the configuration and implementation is for a PSD focal plane array. The use of these techniques assures that the PSD focal plane array possesses the required attributes.

There are several IR SCA fabrication firms that may have the required technology to fabricate sensitive pixelized SCAs, but none has yet applied these technologies to the PSD solution.

The inventive array of PSDs has several advantages including, but not limited to the following:

The PSD array element is similar to a large IR pixel with multiple signal leads (for example, but not limited to, four signals and one common) versus the traditional single signal lead (plus one common).

Very sensitive pixel Trans Impedance Amplifiers (TIAs) have been developed to fit in the same small pitch that pixelized arrays require. The PSD TIA design can be implemented with these pixel-unit cell designs, but have the advantage of much more room under each PSD for improved performance and additional functionality.

Interconnect technology (for example, Indium-bump flip-chip) is widely available from most IR fabrication houses to connect the IR array with the TIA circuits.

Hence, all required technology for very sensitive IR PSD focal plane SCAs is mature and available, but it must be combined as described below and be applied specifically to this problem in order to create suitable devices.

Oceanit Laboratories, Inc.'s Multi-target Optical Sensor Technology (MOST) is a sensor technology and method for ballistic missile defense, battle space-awareness enhancement and multiple-target discrimination. MOST integrates key components of successful Oceanit technologies to create a unique optical sensor capability that provides highly accurate positional metrics with wide field-of-view and at high temporal bandwidth, on a fast-tracking platform. These are described in applicant's co-pending applications: Ser. No. 10/128,433 (ARRAY OF LATERAL EFFECT DETECTORS FOR HIGH-SPEED WAVE-FRONT SENSING . . . ) filed Apr. 24, 2002; Ser. No. 09/189,381 (PHENOMENOLOGICAL ORBIT DEBRIS) filed Jul. 8, 2002; Ser. No. 10/290,527 (AUTONOMOUS ROBOTIC TELESCOPE SYSTEM) filed Nov. 8, 2002; Ser. No. 10/290,543 (GLOBAL SPACE ENVIRONMENT TRACKING SYSTEM) filed Nov. 8, 2002; and Ser. No. 11/079,145 MULTI-TARGET-TRACKING OPTICAL SENSOR-ARRAY TECHNOLOGY filed Mar. 14, 2005; and all claiming priority of earlier filed provisional applications. Each of those applications is incorporated herein by reference in its entirety.

These and further and other objects and features of the invention are apparent in the disclosure, which includes the above and ongoing written specification, with the drawings.

BRIEF DESCRIPTION OF THE DRAWINGS

FIGS. 7A and 7B show the effect of background subtraction with a target object.

DETAILED DESCRIPTION OF THE PREFERRED EMBODIMENTS

Figure 1:
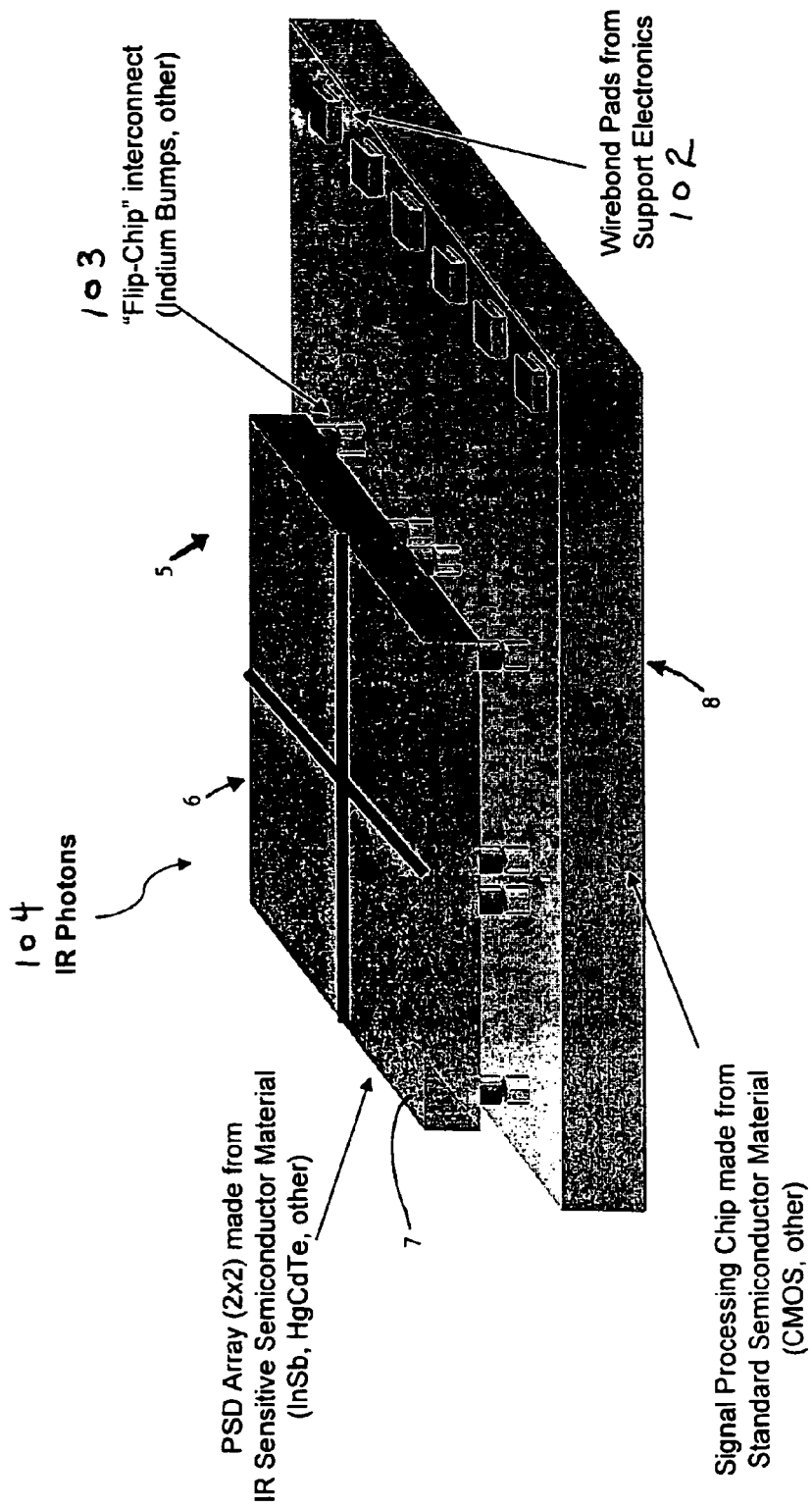
FIG. 1 shows the PSD sensor ship assembly (SCA).

FIG. 1 shows an exemplary Sensor Chip Assembly (SCA). The focal plane array 5 is constructed as a semiconductor chip sandwich—one slice 6 contains the array of PSDs 7 made from IR sensitive semiconductor material, and the other slice 8 contains Trans Impedance Amplifiers (TIAs)—and associated on-chip signal processing elements from an electronic semiconductor material. The SCA resembles those made for pixelized imaging IR SCA focal planes, but the configuration and implementation of which is for a PSD focal plane array. The use of these techniques assures that the PSD focal plane array possesses the required attributes.

The PSD Array 7 may be, but is not limited to, a 2×2 array made from IR sensitive semiconductor material. The IR sensitive semiconductor material may be, but is not limited to, INSB, HgCdTe or other similar materials. IR photons 104 strike the PSD Array 7. Flip-chip interconnects 103 connect the PSD array 7 with the signal processing chip 8. The flip-chip interconnect 103 may be indium bumps or other similar devices. The signal processing chip 8 is made from standard semiconductor material such as, but not limited to, CMOS or other similar materials. Wirebond pads 102 from support electronics are located on the signal processing chip 8.

The PSD array element 5 is similar to a large IR pixel with multiple signal leads (for example, but not limited to, four signals and one common) versus the traditional single signal lead (plus one common). Very sensitive pixel Trans Impedance Amplifiers (TIAs) have been developed to fit in the same small pitch that pixelized arrays require. The PSD TIA design can be implemented with these pixel-unit cell designs, but have the advantage of much more room under each PSD for improved performance and additional functionality. Interconnect technology (for example, Indium-bump flip-chip) is widely available from most IR fabrication houses to connect the IR array with the TIA circuits.

Figure 2A:
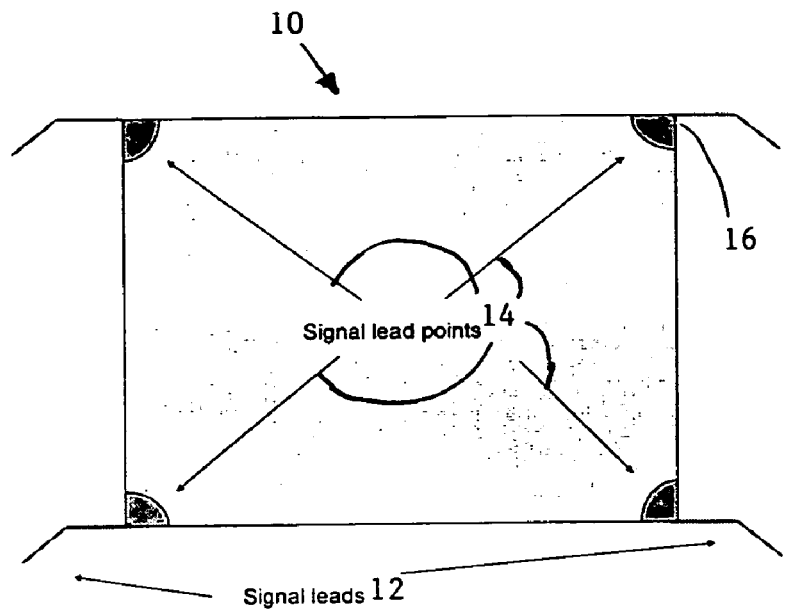
FIGS. 2A and 2B show two PSD element geometries.
Figure 2B:
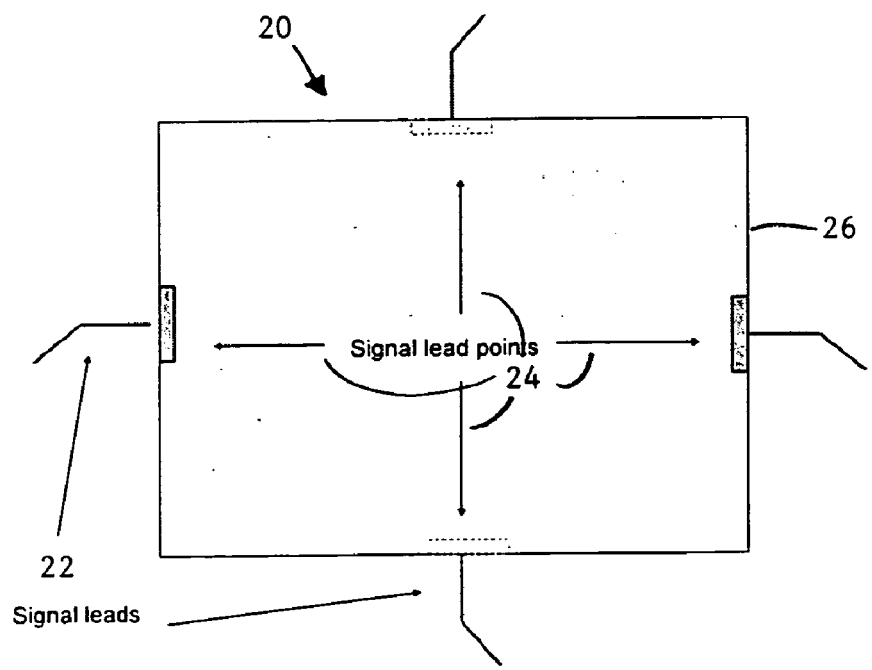

The individual elements within a PSD focal plane array can be constructed in a number of ways. FIGS. 2A and 2B show two PSD element geometries, one tetralateral and one duolateral. The figures show two PSD elements 10, 20. One device 10 with signal lead points 14 to signal leads 12 located in the corners 16 of the device 10 and one device 20 with signal lead points 24 to signal leads 22 on the sides 26. Devices can be built in either manner. Array elements can be of any shape for example, but not limited to, square, rectangular, curved or combinations thereof. Duolateral or tetralateral PSD elements can be used. Any number of PSD elements and combinations thereof may be used.

Figure 3:
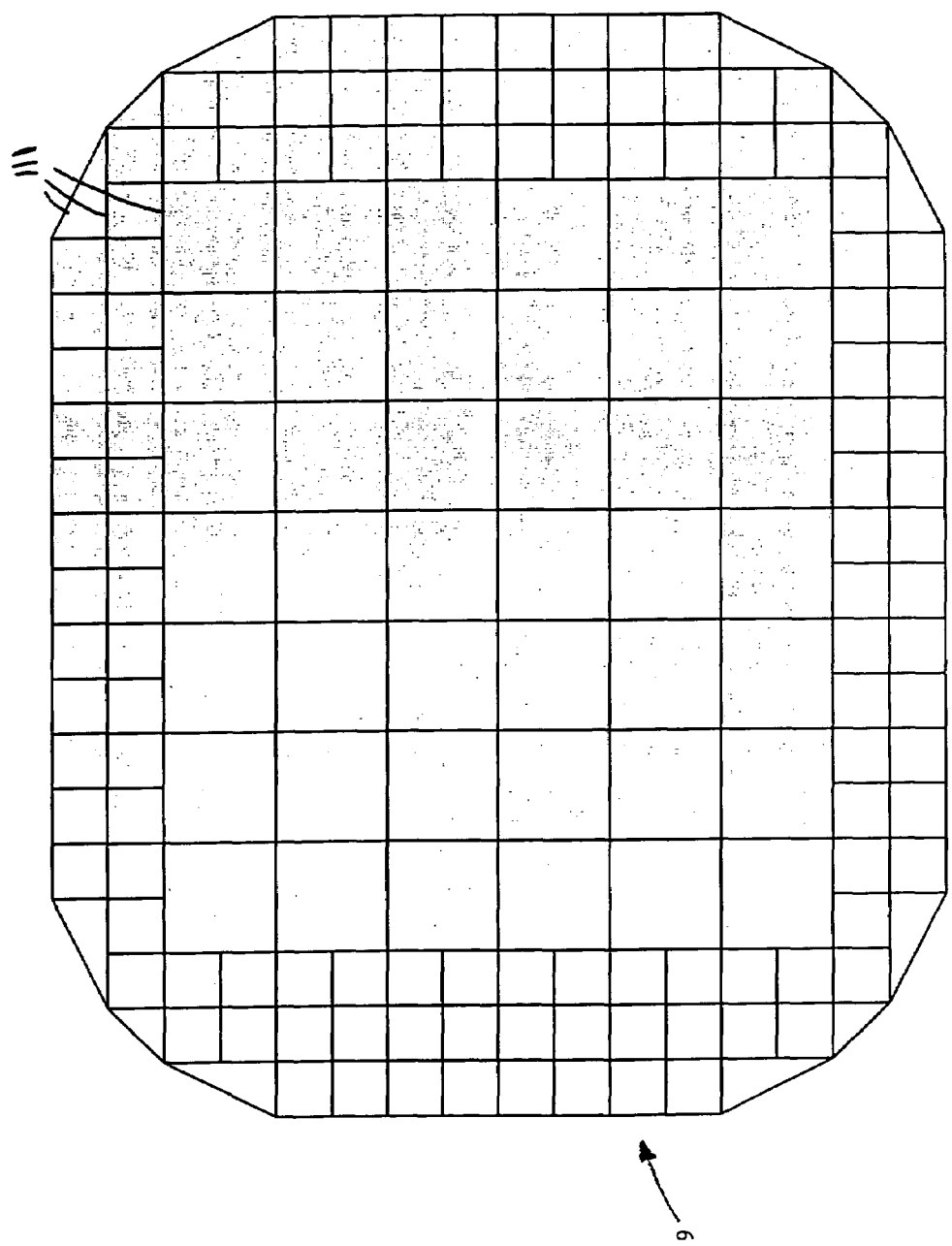
FIG. 3 shows an exemplar FPA combining different PSD elements.

Arrays can be constructed with combinations of these device types as well. The size of the elements can range from several millimeters (for example, but not limited to, ten) to several microns (for example, but not limited to, one hundred), and elements do not need to be the same size. The FPA itself may contain a number of elements ranging from as few as one to a maximum that is limited only by manufacturability and signal processing considerations. FIG. 3 shows an exemplar FPA 9 that combines elements 111 of different sizes and shapes in a circular FPA. Other shapes are within the scope of this invention.

Figure 4:
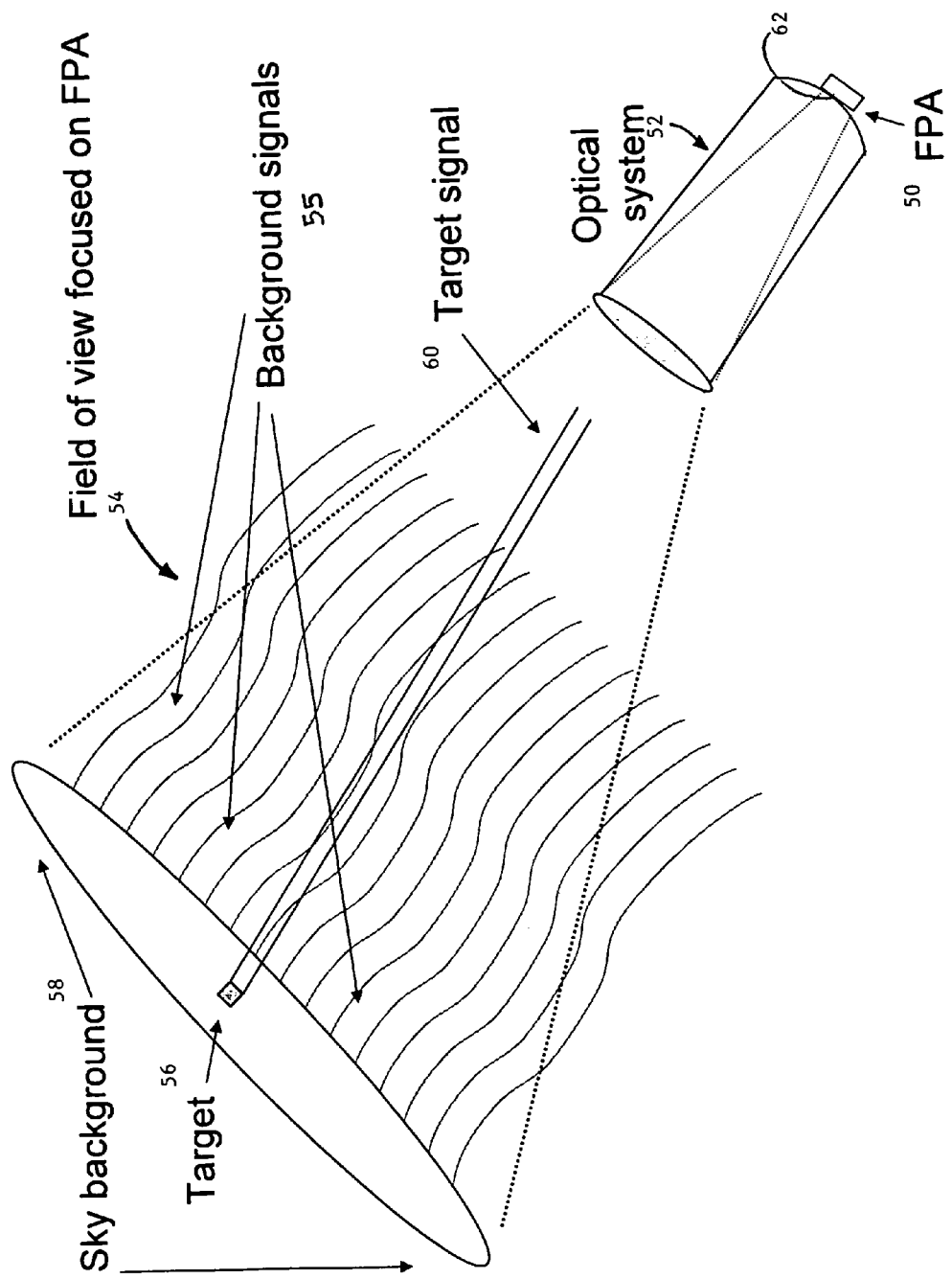
FIG. 4 shows a PSD FPA integrated with an optical system.

In an optical tracking system, the PSD IR FPA 50 is combined with an optics sub-system 52, which gathers light and focuses an image of the system's field-of-view 54 onto the FPA, as shown in FIG. 4. This image includes the target or targets 56 to be tracked as well as the background 58 of sky, stars, earth, and/or other environmental objects. A target object 56 is imaged via a target signal 60 as a single spot 62 on the FPA 50. The background 58 is imaged across the entire FPA. Since the system must function as a passive sensor, the background 58 may be relatively bright compared to the target. The background may be nearly uniform or highly non-uniform with variable background signals 55.

Figure 5:
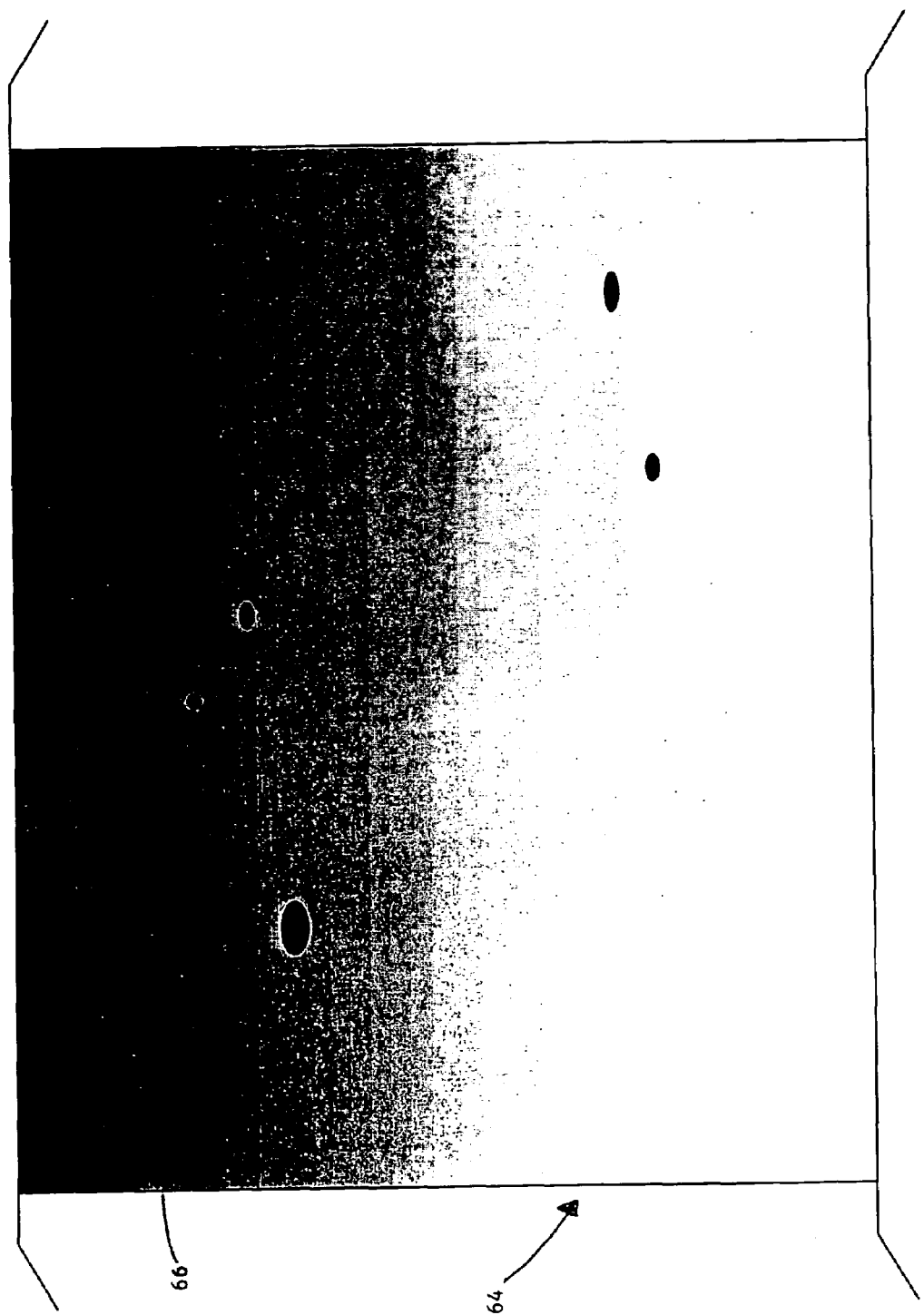
FIG. 5 shows a single PSD element with an uneven background image.

As the first step in processing, the background is measured. Signals will be sampled for every signal lead of every FPA element. This sampling is performed at time $T_0$, when (conceptually) no targets are within the field-of-view. The signal intensity may vary from element to element and from signal lead to signal lead within an element. FIG. 5 depicts an uneven background imaged on a single FPA PSD element 64 and the background signals or currents 66 that result.

Once the background intensity signals are known, signal processing to detect and locate targets can commence using data taken at times $T > T_0$. Periodically, the background will be measured again, and then target detection and location re-commences. The decision to re-measure the background can be based on a number of events including, but not limited to: time, detected background shift, system state, system action, and any combinations of these.

Target detection and location processing at times $T > T_0$ is performed as follows: Signal samples are taken, the measured values for background intensity are subtracted, object detection processing is performed, and target location processing is performed if one or more targets are present.

To perform background subtraction, the background samples from time $T_0$ are subtracted from each signal lead of each array element—for example electronically—during the first stage of signal processing (for example the initial amplification stage). This results in a dramatic reduction in electronic noise and an increase in dynamic range. The background subtraction can be accomplished in a single step (for example, subtract the entire measured background during the initial amplification stage), or in more than one step (for example, subtract an averaged background during the initial amplification stage and a residual background amount in a subsequent signal processing stage).

Figure 6B:
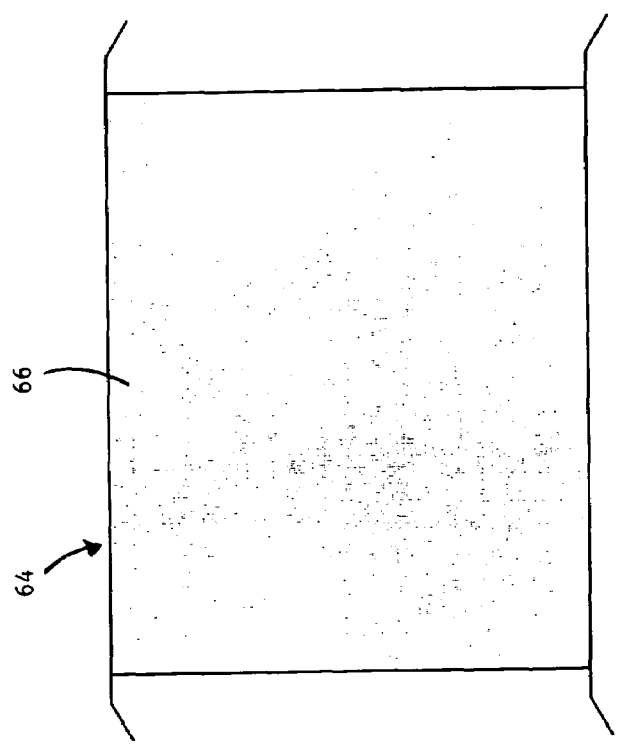
FIGS. 6A and 6B show the effect of background subtraction.
Figure 6A:
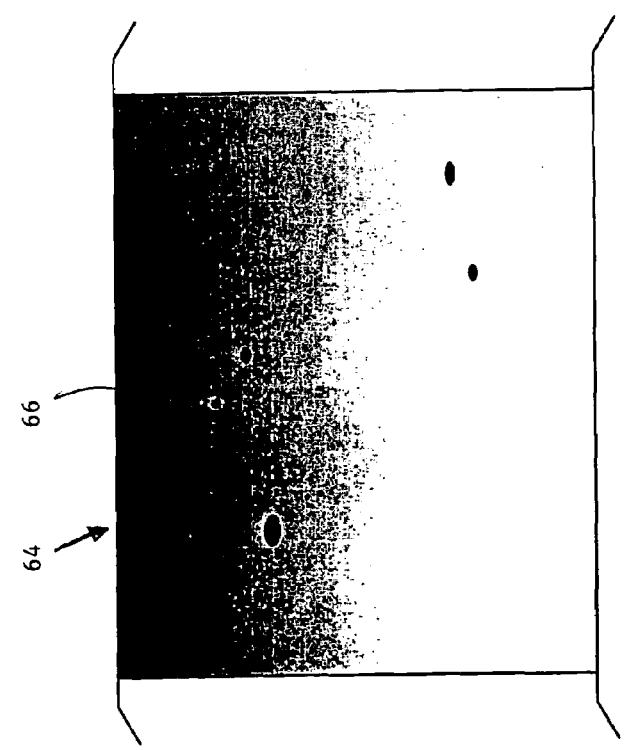

The effect of background subtraction is to create a virtual perfectly dark background. After subtracting the background signals 66 as depicted in FIG. 5, the total resulting signals 68 are zero, consistent with a perfectly dark background, as depicted in FIGS. 6A and 6B. FIG. 6A shows a PSD element illuminated with uneven background signals. FIG. 6B shows an equivalent virtual signal after background subtraction.

FIGS. 7A and 7B show the effect of background subtraction when a target object 70 is imaged on the PSD element 64. FIG. 7A shows a PSD illuminated with uneven background and target signals. FIG. 7B shows an equivalent virtual signal after background subtraction.

Figure 8:
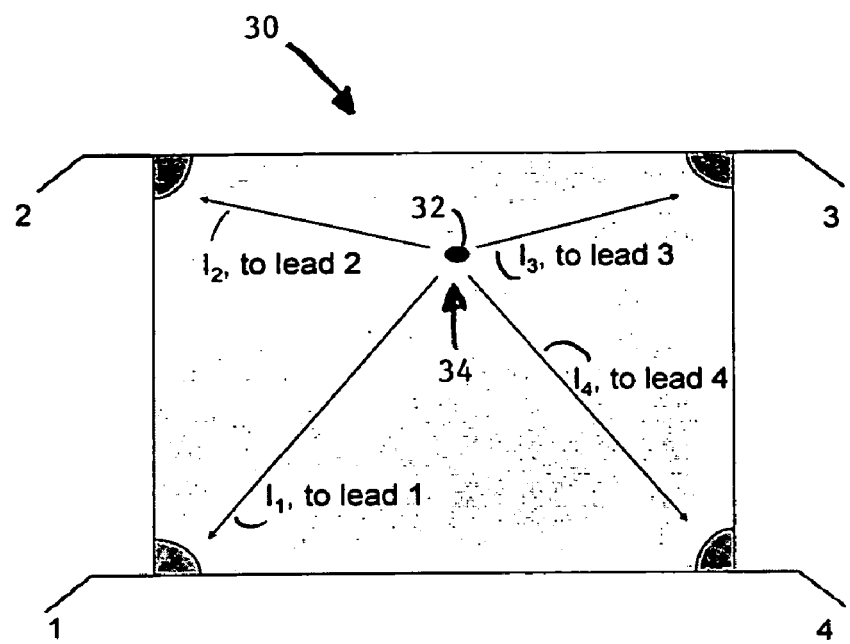
FIG. 8 shows electrical current flow in a PSD element from a target object.

FIG. 8 shows current flow in an individual PSD focal plane element 30 that contains a target signal after the signal subtraction step. Since background signals have been subtracted, the element data is analyzed as a spot illumination 34 against a perfectly dark background. A spot illumination 34 on a PSD element produces electrons at the point of illumination 34 and a current flow $I_1$, $I_2$, $I_3$, $I_4$, from there to the signal leads 1, 2, 3, 4, as shown in FIG. 8.

Once the background signals are subtracted, object detection is performed by analyzing the signal outputs from each FPA element. Signals from all signal leads are used for this analysis. Different mathematical functions may be used to perform the analysis, including but not limited to threshold comparisons, summation, difference, absolute values, integrated values (time integral), and any combinations of these. Single data samples as well as multiple data samples (over time) may be analyzed. Object detection may be performed by using data from elements individually, i.e. only the data from element x, y is used to determine if element x, y contains a target. Alternatively, data from multiple elements can be used to perform the target detection calculations (for example, adjacent elements). Data from each element that contains target object signals are then used to determine target location(s).

Once target detection processing has been performed, location processing is performed for each FPA element that contains a target object 32. Since background signals have been subtracted, the element data is analyzed as a spot illumination 34 against a perfectly dark background. A spot illumination 34 on a PSD element produces electrons at the point of illumination and a current flow $I_1$, $I_2$, $I_3$, $I_4$, from there to the signal leads 1, 2, 3, 4, as shown in FIG. 8.

Figure 9:
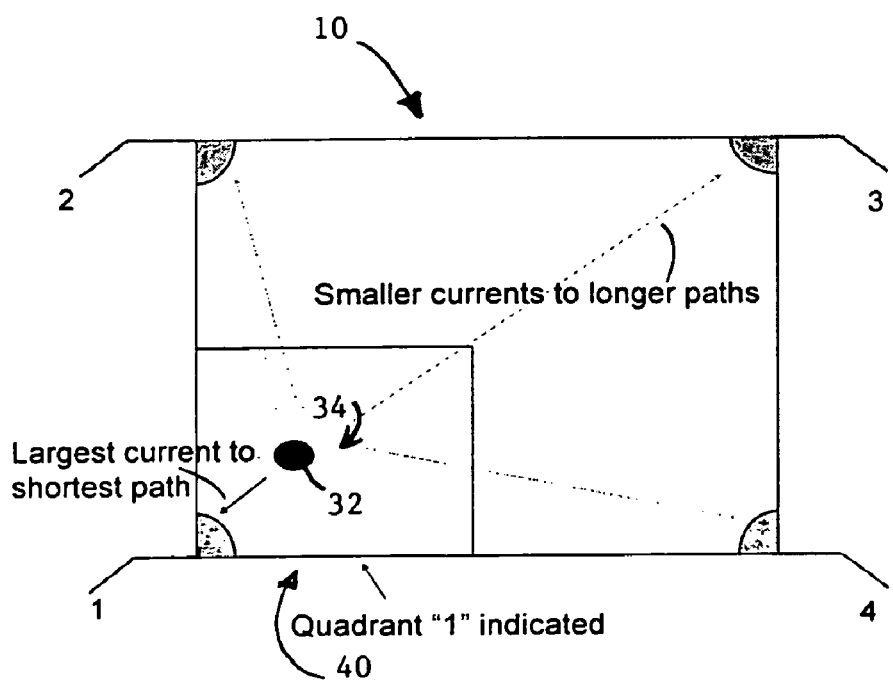
FIG. 9 shows quadrant sector location on a PSD element.

As shown in FIG. 9, the current to each lead 1, 2, 3, 4, is in inverse proportion to the distance from the spot 34 to that lead. This occurs because the PSD element is constructed with a linear sheet resistance between the signal leads and this sheet resistance functions as a current divider. FIG. 9 also shows a quadrant sector 40 location of a PSD element.

The present invention makes it possible to determine the location of the spot using a variety of methods such as, but not limited to:
1. Precise (x, y) location is determined by solving simultaneous equations based on the ratios of current from each of the signal leads.
2. Approximate (x, y) location utilizing a logarithmic or power-law equation based on the signal ratios between the signal leads. This method can be used to achieve location within an error tolerance while reducing signal processing requirements.
3. "Zonal" location is imprecise location on the PSD element that denotes a region within the element area. Rather than using equations or an equation to determine position, signal comparisons and ratio thresholds are used. For example, the largest signal output of the four legs denotes the quadrant for a tetralateral PSD element as shown in FIG. 9. Alternatively, the two largest signal leads denote the quadrant for a duolateral PSD element. A variety of specific sector methods can be used, including quadrant, octant, edge, center, and any combinations of these. This method can be used to achieve acceptable location accuracy while minimizing signal processing.

Traditional location equations (for example, $x_1-x_2$/total) used for stand-alone PSD devices are not used here because they do not produce high accuracy location information for targets located anywhere on the PSD element.

Figure 10:
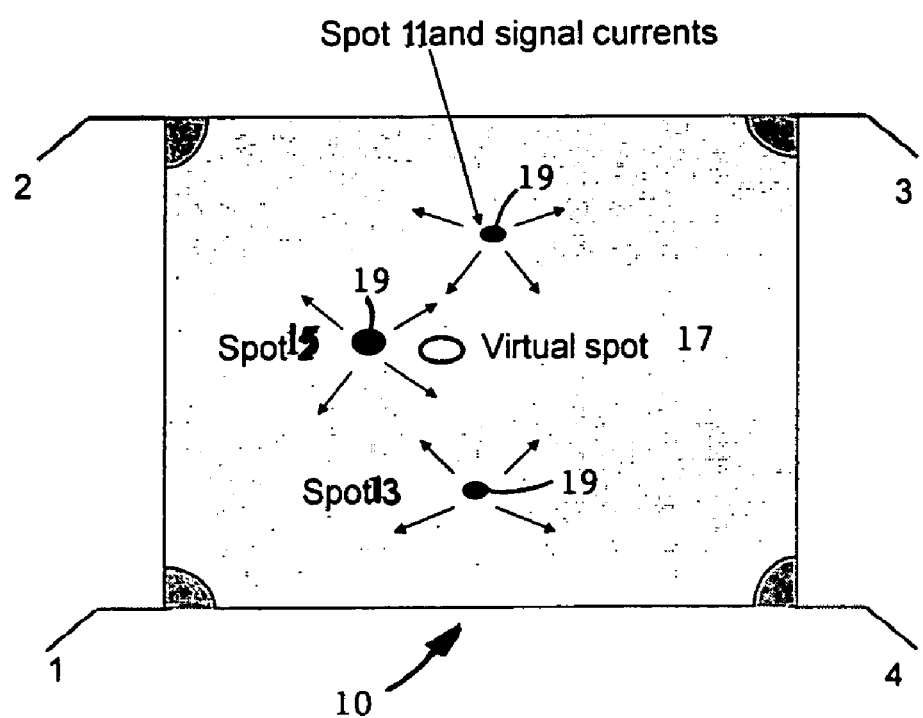
FIG. 10 shows multiple spot illuminations on a PSD element.

FIG. 10 shows multiple spot illuminations 11, 13, 15, on a PSD element 10. When multiple target objects 19 are imaged on the PSD FPA, multiple spot illumination signals will be produced. Two different scenarios may occur:
1. Each spot illumination signal falls onto a separate PSD element.
2. Multiple spots fall onto one or more elements.

In case one, the multiple signals are processed as multiple instances of a single signal as described above. Results can be stored in a table and kept updated over time. In case two, the PSD element responds with superposition of individual signals, as shown in FIG. 10. The resulting signal yields an approximate optical centroid, shown as the virtual signal 17. This allows the PSD to respond to any number of objects with a processing overhead that is equivalent to that for one signal on one element. In other words, the PSD-based system successfully processes a scene no matter how many individual target objects 19 it may contain.

Location processing continues for times $T>T_0$ until the background is re-measured. After re-measuring the background, processing continues using the updated background values.

In some cases, the $T_0$ background measurement for an element may contain a target object. Whether or not this situation exists is unambiguously detected during the object detection processing step. In this situation, location processing and background estimation for times $T>T_0$ are modified as follows:
  The $T_0$ background intensity measurement is treated as an estimated value and is updated iteratively for times $T>T_0$, until a minimum error bound is achieved.
  Location processing proceeds as above, but the locations as determined are treated as estimated locations until the minimum error bound criteria is achieved.
  Iterative updates to the background intensity value are calculated using mathematical functions including, but not limited to, averages, maximum and minimum levels, time averages, error values, and any combinations of these. These calculations are performed using single data samples (in time), multiple data samples over time, data from the element containing the target object signal at time $T_0$, data from elements that did not contain target object signals at time $T_0$, and any combinations of these.

The invention includes, but is not limited to, the following:
1. Use of a position sensing detector (PSD) focal plane array (FPA) in an optical system operating in a passive mode (no active illumination by laser or other means).
2. A PSD FPA manufactured as a semiconductor chip sandwich to form a sensor chip assembly (SCA).
3. The IR FPA is manufactured from a single substrate of IR sensitive semiconductor material. Individual array elements and interconnect points are created by using circuit masks and implant techniques in the manufacturing process.
4. The PSD signal processing electronic circuits are manufactured as an integrated circuit from a single substrate of electronic semiconductor material.
5. The PSD IR array and PSD signal processing electronic circuits are connected using interconnect technology to form the SCA.
6. The PSD FPA SCA may contain any number of elements, as few as one, and up to a maximum that is dictated by manufacturability and signal processing considerations.
7. Array elements can be any shape including square, rectangular, curved, and combinations.
8. Array elements can be small or large in area, and not all elements in an array need to be the same size.
9. Noise mitigation and dynamic range enhancement through background mitigation.
10. Methods to perform background mitigation by using exact background measurement and signal subtraction for each element in the array, as well as for each signal lead of each element in the array.
11. Methods to perform background signal subtraction in a single step during the first stage of signal processing.
12. Methods to perform background signal subtraction in multiple steps, with the first step occurring during the first stage of signal processing.
13. Detection of background estimation errors through object detection.
14. Correction of detected background estimation errors through iterative background estimation and update.

15. Performing iterative background estimation and update by using samples from individual or multiple FPA elements.
16. Object detection by processing background mitigated signals from individual or multiple FPA elements using a variety of mathematical functions.
17. Object location by processing background mitigated signal from individual elements using multiple methods.
   a. Processing the signals by solving simultaneous equations to determine an exact location.
   b. Processing the signals by solving logarithmic or power-law equations that represent an approximate location.
   c. Processing the signals by using logical comparison techniques for location within a zonal of an FPA element (zonal location).
18. Methods for operation against multiple targets and large numbers of densely packed targets.
19. Methods to provide guaranteed timeliness performance (latency and data frames per second) in situations with large numbers of densely packed target objects.

While the invention has been described with reference to specific embodiments, modifications and variations of the invention may be constructed without departing from the scope of the invention.

The invention claimed is:

1. A passive optical tracking apparatus comprising:
   a sensor chip assembly comprising a first layer and, a second layer,
   the first layer comprising multiple position sensing detectors made from infrared sensitive semiconductor material, wherein multiple individual position sensing detectors are arranged in an array of position sensing detectors,
   the second layer comprising trans impedance amplifiers and associated on-chip signal processing elements made from an electronic semiconductor material,
   interconnects between the first layer and the second layer, and
   wirebond pads from support electronics on the second layer.

2. The apparatus of claim 1, wherein the individual position sensing detectors are created with circuit masks and implant techniques.

3. The apparatus of claim 1, wherein the first layer is made of INSB or HgCdTe.

4. The apparatus of claim 1, wherein the position sensing detectors are tetralateral or duolateral.

5. The apparatus of claim 2, wherein position sensing detectors of various sizes and shapes are used in the array of position sensing detectors.

6. The apparatus of claim 1, wherein the second layer is made of CMOS.

7. The apparatus of claim 1, wherein the interconnects are Indium-bump flip-chips.

8. The apparatus of claim 1, further comprising an optics subsystem for gathering and focusing an image of a field-of-view onto the position sensing detector.

9. The apparatus of claim 1, wherein noise mitigation and dynamic range enhancement are performed through background mitigation.

10. A passive optical tracking apparatus comprising:
    a sensor chip assembly comprising a first layer and a second layer,
    the first layer comprising at least one position sensing detector made from infrared sensitive semiconductor material,
    the second layer comprising trans impedance amplifiers and associated on-chip signal processing elements made from an electronic semiconductor material,
    interconnects between the first layer and the second layer,
    wirebond pads from support electronics on the second layer, and
    wherein multiple individual position sensing detectors are arranged in an array of position sensing detectors, wherein a potential target is identified by measuring an initial signal in the field-of-view for each position sensing detector, taking a new signal for each position sensing detector at subsequent times, comparing the initial signal and the new signal, subtracting the initial signal from the new signal to remove background, identifying potential targets by spot illumination after the subtracting, analyzing the spot illumination with current various from signal leads, and remeasuring and updating the background if necessary.

11. The apparatus of claim 10, wherein multiple targets are identified and tracked at a single time.

12. A passive optical tracking method comprising:
    providing a focal plane array comprising a sensor chip assembly comprising a first layer and a second layer, the first layer comprising at least one position sensing detectors made from infrared sensitive semiconductor material wherein multiple positions sensing detectors are arranged in an array, the second layer comprising trans impedance amplifiers and associated on-chip signal processing elements made from an electronic semiconductor material, interconnects between the first layer and the second layer, and wirebond pads from support electronics on the second layer,
    providing an optical subsystem for gathering and focusing an image of a field-of-view onto the focal plane array,
    measuring an initial signal in the field-of-view for each position sensing detector,
    taking a new signal for each position sensing detector at subsequent times,
    comparing the initial signal and the new signal,
    subtracting the initial signal from the new signal to remove background,
    identifying potential targets by spot illumination after the subtracting,
    analyzing the spot illumination with current various from signal leads, and
    remeasuring and updating the background if necessary.

13. The method of claim 12, wherein the identifying potential targets is performed using data from one or more position sensing detectors.

14. The method of claim 12, further comprising identifying location for each position sensing detector with a potential target.

15. The method of claim 14, wherein current at each lead on individual position sensing detectors is measured to determine location.

16. The method of claim 15, wherein location is determine by solving simultaneous equations.

17. The method of claim 15, wherein approximate location is determined by utilizing logarithmic or power-law equations.

18. The method of claim 15, wherein zonal location is determined by signal comparisons and ratio thresholds.

19. The method of claim 12, wherein the initial signal is iteratively updated until a minimum error bound is achieved for detecting targets in the initial signal.

20. The method of claim 19, wherein the initial signal is treated as an estimate.

* * * * *

UNITED STATES PATENT AND TRADEMARK OFFICE
CERTIFICATE OF CORRECTION

| | | |
|---|---|---|
| PATENT NO. | : 7,333,181 B1 | Page 1 of 1 |
| APPLICATION NO. | : 11/434558 | |
| DATED | : February 19, 2008 | |
| INVENTOR(S) | : Basil H. Scott, Randy Wolfshagen and Jeff Buck | |

It is certified that error appears in the above-identified patent and that said Letters Patent is hereby corrected as shown below:

Column 1, line 5, insert the following paragraph:

--This invention was made with Government support under Contract No. HQ0006-04-C-0008 awarded by the Department of Defense. The Government has certain rights in this invention.--

Signed and Sealed this

Second Day of August, 2011

David J. Kappos
*Director of the United States Patent and Trademark Office*